United States Patent
Feucht et al.

(10) Patent No.: US 8,466,688 B2
(45) Date of Patent: Jun. 18, 2013

(54) DEVICE FOR CHECKING THE ATTACHMENT OF A CIRCUIT BOARD ON A CARRIER

(75) Inventors: Thomas Feucht, Wimsheim (DE); Andreas Arlt, Marbach (DE)

(73) Assignee: Knorr-Bremse Systeme Fuer Nutzfahrzeuge GmbH, Munich (DE)

( * ) Notice: Subject to any disclaimer, the term of this patent is extended or adjusted under 35 U.S.C. 154(b) by 290 days.

(21) Appl. No.: 12/451,138

(22) PCT Filed: Apr. 25, 2008

(86) PCT No.: PCT/EP2008/003363
§ 371 (c)(1),
(2), (4) Date: Feb. 23, 2010

(87) PCT Pub. No.: WO2008/135183
PCT Pub. Date: Nov. 13, 2008

(65) Prior Publication Data
US 2010/0148796 A1   Jun. 17, 2010

(30) Foreign Application Priority Data
May 4, 2007  (DE) .......................... 10 2007 020 882

(51) Int. Cl.
*G01R 31/04*   (2006.01)
(52) U.S. Cl.
USPC .................. 324/538; 324/750.16; 324/756.07
(58) Field of Classification Search
USPC ........................................................ 324/538
See application file for complete search history.

(56) References Cited

U.S. PATENT DOCUMENTS

| | | | |
|---|---|---|---|
| 5,065,282 A * | 11/1991 | Polonio | 361/752 |
| 6,160,402 A | 12/2000 | Naglich et al. | |
| 6,188,019 B1 * | 2/2001 | Baur et al. | 174/51 |
| 6,940,412 B2 * | 9/2005 | Clark | 340/635 |
| 7,066,039 B1 | 6/2006 | Orlogi et al. | |
| 2004/0150523 A1 | 8/2004 | Kelsch et al. | |
| 2005/0116733 A1 | 6/2005 | Barr et al. | |

FOREIGN PATENT DOCUMENTS

| | | |
|---|---|---|
| DE | 43 31 954 | 11/1994 |
| JP | 09 159558 | 6/1997 |
| WO | 03/005048 | 1/2003 |

OTHER PUBLICATIONS

European Patent Office, International Preliminary Report on Patentability, Nov. 19, 2009, from International Patent Application No. PCT/EP2008/003363, filed on Apr. 25, 2008.
European Patent Office, Translation of International Preliminary Report on Patentability, Dec. 17, 2009, from International Patent Application No. PCT/EP2008/003363, filed on Apr. 25, 2008.

* cited by examiner

*Primary Examiner* — Minh N Tang
(74) *Attorney, Agent, or Firm* — Kenyon & Kenyon LLP

(57) ABSTRACT

A device for checking the attachment of a circuit board on a carrier, in particular a housing, has on each attachment point a pair of mutually associated electrically conductive contact surfaces and an electrically conductive connecting arrangement, which connects the circuit board mechanically to the carrier and at the same time connects the electrically conductive contact surfaces of the respective pair electrically to each other. At least one of the electrically conductive contact surfaces of a pair is situated on the circuit board. The other contact surface may likewise be situated on the circuit board or, for an electrically conductive carrier, even on the carrier. The respective pairs of conductive contact surfaces and the electrically conductive connecting arrangement form an electric circuit, which may be connected in a series circuit or a parallel circuit. An evaluation circuit checks whether the electric circuit thus formed is closed.

19 Claims, 3 Drawing Sheets

DEVICE FOR CHECKING THE ATTACHMENT OF A CIRCUIT BOARD ON A CARRIER

FIELD OF THE INVENTION

The present invention relates to a device for checking the attachment of a circuit board on a carrier.

BACKGROUND INFORMATION

Fastening circuit boards of electronic devices on a carrier is generally understood in the related art. Often, this carrier is a housing of the electronic device. The attachment is performed using a conventional connecting arrangement, such as e.g. screws, rivets or also electrically conductive adhesive bonds. These connecting arrangements often fulfill not only the mechanical function of holding or fastening, but also an electrical function. Thus, metallic carriers or housings also act as electrical shields against electromagnetic radiation, for shunting static charges or for grounding the housing and at the same time for fixing a ground potential for an electric or electronic circuit situated on the circuit board.

If the circuit board is mechanically fastened on the carrier, then this does not guarantee that the desired electrical connection between the carrier or the housing and the circuit board is also properly established. Once the housing is closed, it is normally no longer possible to determine whether all electrical connections between the housing and circuit boards were correctly established. This may result in failures or malfunctions of the electronic device or in a noncompliance with specified properties such as EMC stability for example. Mechanical vibrations, as occur particularly frequently in devices installed in motor vehicles, may also result in malfunctions, which is particularly critical if the power supply (normally the negative pole of the vehicle electrical system voltage) is connected to the housing.

An objective of the exemplary embodiments and/or exemplary methods of the present invention is therefore to create a device which makes it possible to check a proper attachment of a circuit board on a carrier. This is to be possible even when the carrier is a closed housing. It is also to be possible to perform the check while an electronic device is operated in use, for example in a motor vehicle.

This objective is achieved by the features described herein. Advantageous refinements and developments of the exemplary embodiments and/or exemplary methods of the present invention are disclosed by the further descriptions herein.

One aspect of the exemplary embodiments and/or exemplary methods of the present invention is to include electrically conductive connecting arrangement in an electric circuit. This electric circuit is closed when the connecting arrangement have established a proper electrical connection between the circuit board and the carrier. The connecting arrangement thus act as an electrical switch for the electric circuit thus established. This electric circuit may be checked by an evaluation device, for example by measuring the resistance value of the electric circuit. This evaluation device may be used in the final testing in production. It may also be accommodated, however, as an evaluation circuit on the circuit board itself and thus perform the check continuously in operation. With respect to the exemplary embodiments and/or exemplary methods of the present invention one may assume that when there is a proper electrical connection between the circuit board and the carrier, the mechanical attachment is properly established as well. For checking several connecting points between the circuit board and the carrier, the exemplary embodiments and/or exemplary methods of the present invention provides two basic variants, namely, on the one hand, a serial circuit and, on the other hand, a parallel circuit of all connecting points to be monitored in the electric circuit.

The exemplary embodiments and/or exemplary methods of the present invention is also applicable if the carrier is made of electrically nonconductive material, in which case the mentioned serial circuit is practical. In this case, two adjacent contact surfaces may be provided per attachment point on the circuit board, which are bridged by the electrically conductive connecting arrangement.

The exemplary embodiments and/or exemplary methods of the present invention is explained in greater detail below on the basis of exemplary embodiments in connection with the drawing.

DETAILED DESCRIPTION

A screw is shown as the connecting arrangement in the exemplary embodiments described below. It should be pointed out that all conceivable electrically conductive connecting arrangement may be used such as e.g. screws, rivets, electrically conductive adhesives, clamping connections having elastically preloaded spring arms, latch and snap connections, soldered connections, welded connections and any other suitable arrangement known in the related art, by which a circuit board may be fastened on a carrier, while at the same time establishing an electrical connection between two contact surfaces.

Furthermore it should be pointed out that in the subsequent exemplary embodiments the aforementioned carrier is represented as a housing. Other components, of course, may also be used as carriers such as e.g. the walls of control cabinets, shielding plates or other structures intended to hold a circuit board.

Figure 1:
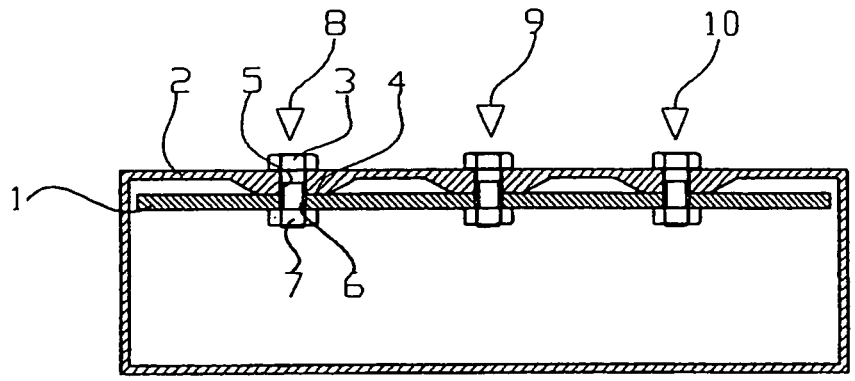
FIG. 1 shows a cross section of a circuit board attached in a housing.
Figure 2:
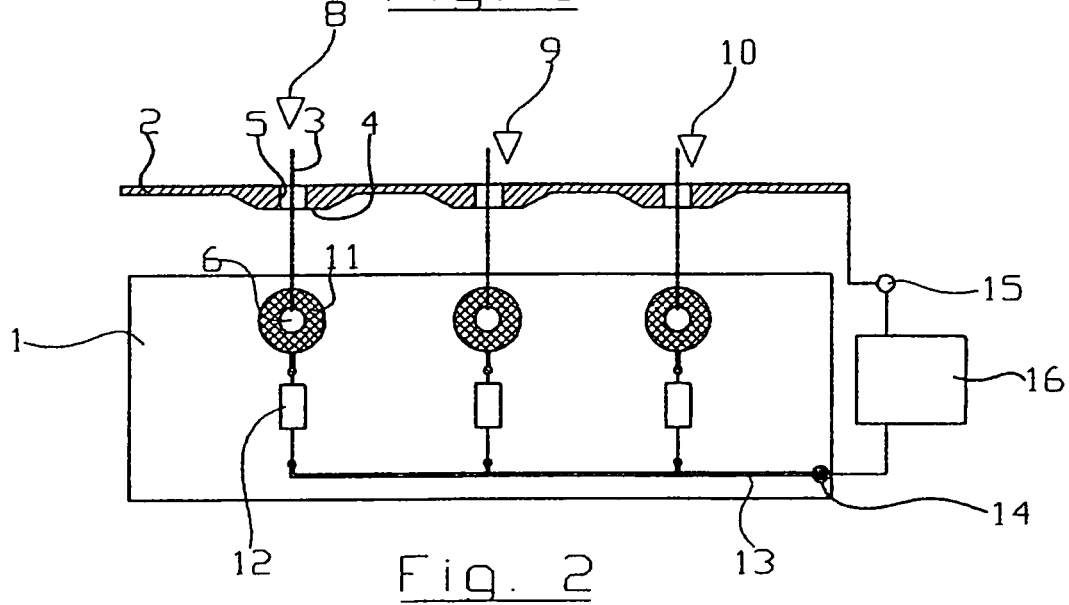
FIG. 2 shows a diagrammatic sketch of the device according to the present invention having a part of the housing shown in a sectional view and the circuit board shown in a schematic top view.
Figure 3:
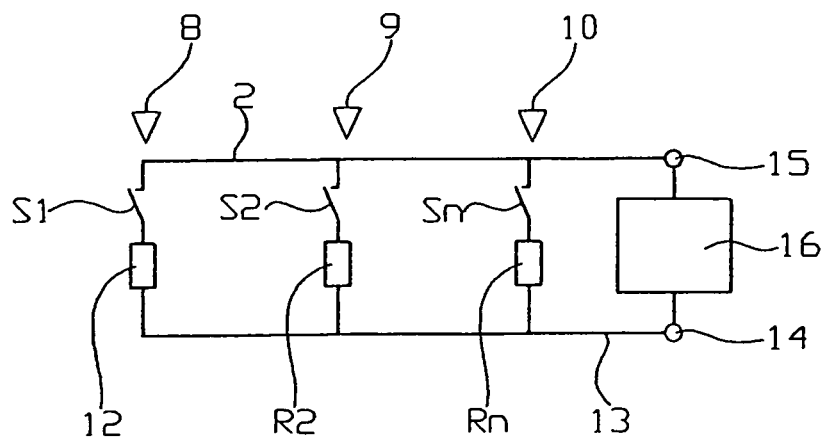
FIG. 3 shows an electrical equivalent circuit diagram of an electric circuit according to the first exemplary embodiment of the present invention.

Reference shall now be made to the first exemplary embodiment of FIGS. 1 through 3.

FIG. 1 shows a cross section of a circuit board 1, which is situated in a closed housing 2 and is fastened by at least one screw 3 on housing 2. In the region of screw 3, housing 2 has a first contact surface 4, which is developed as a projection jutting inwardly into the housing, the housing having a bore 5 for screw 3 to pass through and this bore 5 extending through contact surface 4.

Circuit board 1 has a corresponding bore 6, through which screw 3 extends as well. In the represented exemplary embodiment, screw 3 is fastened by a nut 7. Screw 3, first contact surface 4 and circuit board 1 having bore 6 together form a first attachment point 8. The represented exemplary embodiment shows three such attachment points, namely, fastening points 8, 9 and 10, which here are respectively constructed in the same manner.

FIG. 2 shows that a second contact point 11 is applied on circuit board 1. This contact point 11 here has the shape of a circular ring situated around bore 6. When circuit board 1 is in the mounted state, first contact surface 4 and second contact surface 11 contact each other. Circuit board 1 and housing 2 and thus also the two contact surfaces 4 and 11 are pressed against each other by screw 3 and nut 6 such that the two contact surfaces 4 and 11 are electrically connected to each other, the contact resistance being very low and being in the magnitude of 0 ohm.

The same applies to all other attachment points such as e.g. attachment points 9 and 10.

Second contact surface 11 is connected to an electrical resistor 12. The other end of resistor 12 is connected to a conductor track 13, which is connected to a terminal pin 14.

In the same manner, the second contact surfaces of attachment points 9 and 10 are connected to conductor track 13 via a resistor. Housing 2 in this case also has a terminal pin 15.

An evaluation device or an evaluation circuit 16 is connected to the two terminal pins 14 and 15, which measure(s) for example the electrical resistance of an electric circuit situated between the two terminal pins 14 and 15. The evaluation device is able to compare the measured resistance value to a specified value and generate an error signal in the event of deviations between the measured and the specified value.

FIG. 2 shows that the first and second contact surfaces 4 and 11 respectively associated with each other act as an electrical switch, which is closed when the two contact surfaces are connected properly. The electric circuit situated between terminal pins 14 and 15 is thus formed by a parallel connection of the individual pairs of contact surfaces together with resistor 12 connected in series with them, this parallel connection being situated between housing 2 acting as an electrical conductor and conductor track 13.

FIG. 3 depicts the equivalent circuit diagram. The switches formed by the respective pairs of contact surfaces are indicated by S1, S2 and Sn. The resistors of the individual connecting points to be monitored are indicated by 12, R2 and Rn. The equivalent circuit diagram of FIG. 3 immediately shows that the resistance value measured between terminal pins 14 and 15 depends on whether switches Si through Sn are closed or open. The resistance value of resistors 12, R2 and Rn is set for example to 100 k ohm.

From the measured resistance value of the electric circuit between terminal pins 14 and 15 one may thus see clearly whether all of the pairs of contact surfaces make proper electrical contact.

Finally it should be pointed out that evaluation device 16 may also be installed on circuit board 1 in the form of an evaluation circuit and thus be available even during the normal use of the circuit board.

Figure 4:
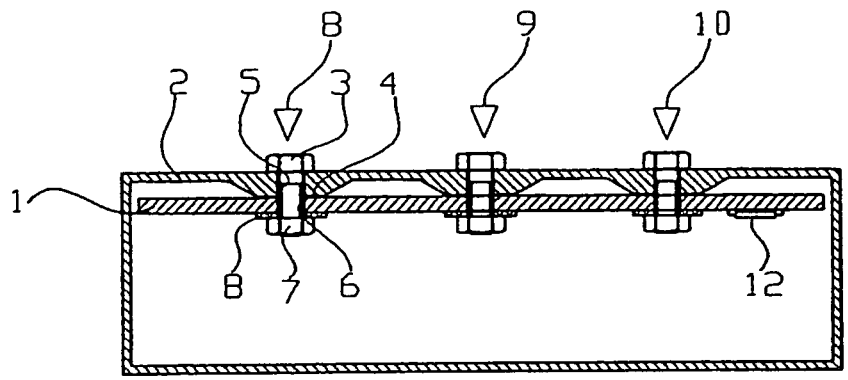
FIG. 4 shows a cross section similar to FIG. 1 of a housing having a circuit board fastened within it according to a second exemplary embodiment of the present invention.
Figure 5:
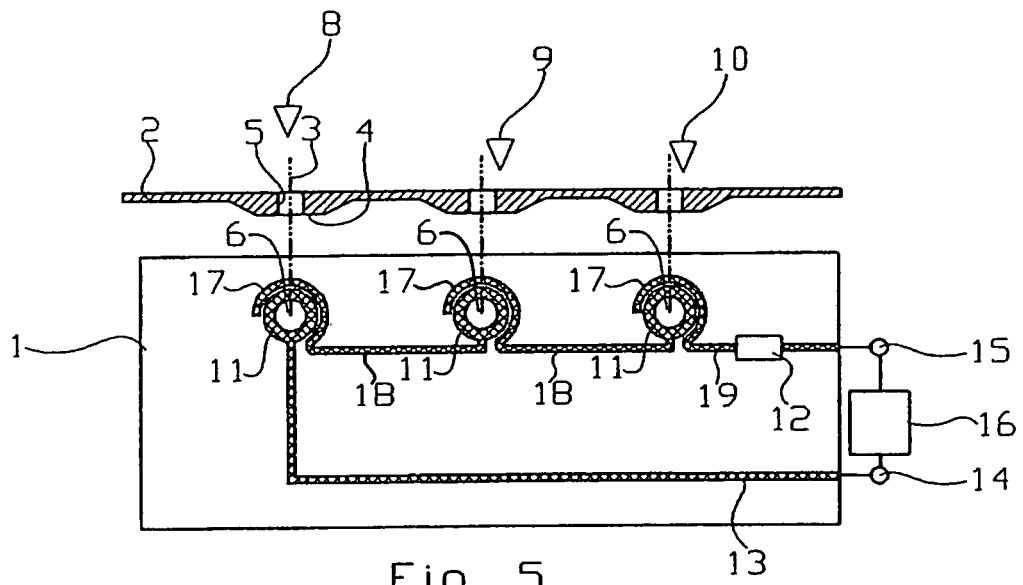
FIG. 5 shows a view similar to FIG. 2 according to the second exemplary embodiment of the present invention.
Figure 6:
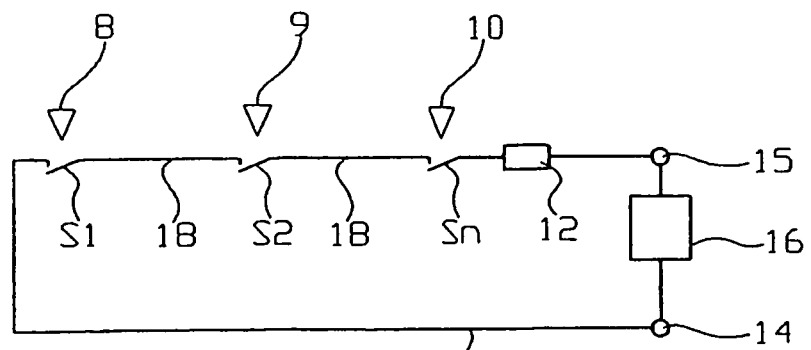
FIG. 6 shows an electrical equivalent circuit diagram of an electric circuit according to the second exemplary embodiment of the present invention.

The second exemplary embodiment of the present invention shown in FIGS. 4-6 differs from the first exemplary embodiment of FIGS. 1-3 essentially in that the two contact surfaces are disposed on circuit board 1. The electrical connection may then be established by the connecting arrangement, that is, for example a screw head, a washer or nut 6. This exemplary embodiment is thus suitable even for carriers or housings made of electrically nonconductive material. It is also possible, however, for the electrical connection between the two contact surfaces 11 and 17 disposed on circuit board 1 to be established by contact surface 4 of the housing.

The second exemplary embodiment additionally differs from the first exemplary embodiment by the fact that all pairs of mutually associated first and second contact surfaces are electrically connected in a series circuit.

FIG. 5 shows that the mutually associated contact surfaces are constructed as follows:

Second contact surface 11 is identical to the first exemplary embodiment. It is developed as a circular ring surface concentrically with respect to bore 6 of circuit board 1. First contact surface 17 is developed as a ring segment surface, which is situated concentrically with respect to first contact surface 11, a gap existing between the two contact surfaces, which is to be bridged by the electrically conductive connecting arrangement. In the event that housing 2 is electrically conductive, its contact surface 4 situated all around bore 5 may form the connecting arrangement. In the event that housing 2 is not electrically conductive, an electrically conductive adhesive on contact surface 4 may establish the electrical connection between the two contact surfaces 11 and 17. A part of the screw connection, for example a washer 8 or nut 7 shown in FIG. 4, may also establish the electrical connection between the two contact surfaces 11 and 17.

The circuit as a series circuit is established by the fact that first contact surface 17 of an attachment point (e.g. 8) is connected to second contact surface 11 of an adjacent connecting point (e.g. 9), which may occur by a conductor track 18 or also a wire that is soldered in. In an analogous manner, first and second contact points 11 and 17 of all other attachment points (such as e.g. of attachment points 9 and 10) are connected to each other in the same manner.

For the series circuit one only needs a measuring resistor such as e.g. resistor 12, which is connected in at any point of the electric circuit, for example between first contact surface 17 of attachment point 10 and most proximate terminal pin 15. Second contact surface 11 of first attachment point 8 is connected to second terminal pin 14 via an electrical line such as e.g. a conductor track 13. Evaluation device 16 in turn is connected between the two terminal pins 14 and 15.

In the equivalent circuit diagram of FIG. 6, which corresponds to the exemplary embodiment of FIGS. 4 and 5, the respective pairs of contact surfaces are represented as switches S1, S2 through Sn. It may be seen that in this variant evaluation device 16 measures the resistance value of resistor 12 only when all switches S1 through Sn are closed. If only one or several switches are open, i.e. one or several attachment points 8, 9 or 10 are not properly fastened, then the electric circuit is interrupted and the resistance value ascertained by evaluation device 16 is infinite.

Figure 7:
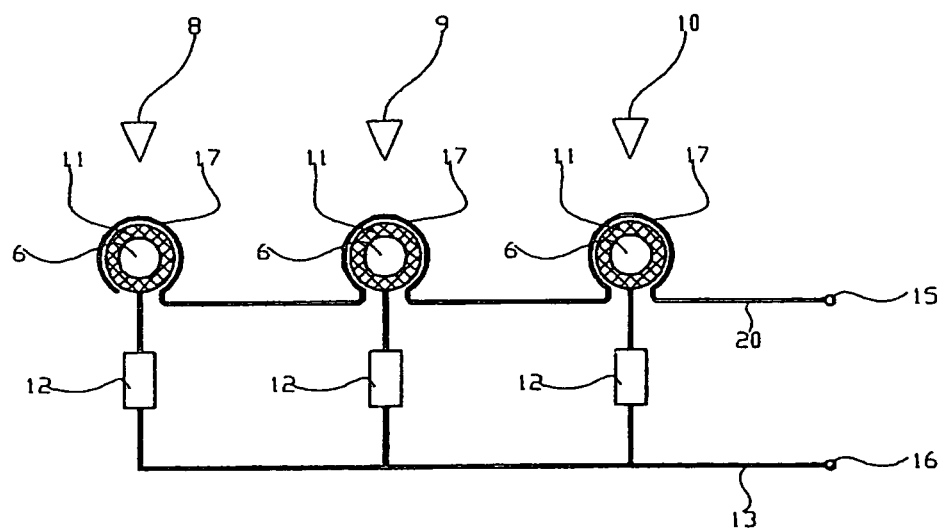
FIG. 7 shows a top view of the circuit board according to another variant of the present invention.

As may be seen from FIG. 7, the principles of the two variants of the first and second exemplary embodiment may also be combined with each other. FIG. 7 shows a schematic top view of the circuit board, which for each attachment point 8, 9 or 10 carries the two contact surfaces 11 and 17 analogous to FIG. 5, all first contact surfaces 17 of all attachment points being connected to one another and thus forming one continuous electrical conductor 20, which is connected to terminal pin 15. Second contact surfaces 11 of all attachment points 8, 9 and 10 are connected respectively via a resistor 12 to conductor track 13, which is connected to terminal pin 16.

What is claimed is:

1. A device for checking an attachment of a circuit board on a carrier, comprising:
   at least one pair of mutually associated electrically conductive contact surfaces;

an electrically conductive connecting arrangement, which connects the circuit board mechanically to the carrier and at the same time connects the electrically conductive contact surfaces of the at least one pair electrically to each other;

at least one of the at least one pair of electrically conductive contact surfaces is a surface of the carrier and the other one of the at least one pair of electrically conductive contact surfaces is disposed on the circuit board; and an evaluation circuit, which is connected to the conductive contact surfaces and which checks whether an electric circuit formed by the mutually associated contact surfaces and the electrically conductive connecting arrangement is closed.

2. The device of claim 1, wherein the electrically conductive contact surface situated on the circuit board has the shape of a circular ring in the top view and surrounds a bore of the circuit board.

3. The device of claim 1, wherein several pairs of contact surfaces are provided and all pairs of contact surfaces are connected to one another in a parallel circuit.

4. The device of claim 3, wherein each branch of the parallel circuit has at least one resistor.

5. The device of claim 1, wherein several pairs of contact surfaces are provided and all pairs of contact surfaces are connected to one another in a series circuit.

6. The device of claim 5, wherein the series circuit has at least one resistor.

7. The device of claim 1, wherein the electrically conductive connecting arrangement is one of a screw, a rivet, a washer, a nut, an electrically conductive adhesive, a soldered connection, a welded connection or an electrically conductive clamp, a latch and a snap device.

8. The device of claim 1, wherein the carrier is a housing accommodating the circuit board.

9. The device of claim 1, wherein the evaluation circuit is situated on the circuit board.

10. The device of claim 1, wherein the electrically conductive connecting arrangement is one of a screw, a rivet, a washer, a nut, an electrically conductive adhesive, a soldered connection, a welded connection or an electrically conductive clamp, a latch and a snap device, wherein the carrier is a housing accommodating the circuit board.

11. The device of claim 10, wherein the evaluation circuit is situated on the circuit board.

12. The device of claim 10, wherein several pairs of contact surfaces are provided and all pairs of contact surfaces are connected to one another in a parallel circuit, and wherein each branch of the parallel circuit has at least one resistor.

13. The device of claim 10, wherein several pairs of contact surfaces are provided and all pairs of contact surfaces are connected to one another in a series circuit, and wherein the series circuit has at least one resistor.

14. The device of claim 1, wherein the electrically conductive contact surface situated on the circuit board has the shape of a circular ring in the top view and surrounds a bore of the circuit board, and wherein several pairs of contact surfaces are provided and all pairs of contact surfaces are connected to one another in a parallel circuit.

15. The device of claim 14, wherein each branch of the parallel circuit has at least one resistor.

16. The device of claim 14, wherein the electrically conductive connecting arrangement is one of a screw, a rivet, a washer, a nut, an electrically conductive adhesive, a soldered connection, a welded connection or an electrically conductive clamp, a latch and a snap device, wherein the carrier is a housing accommodating the circuit board, and wherein the evaluation circuit is situated on the circuit board.

17. The device of claim 1, wherein the electrically conductive contact surface situated on the circuit board has the shape of a circular ring in the top view and surrounds a bore of the circuit board, and wherein several pairs of contact surfaces are provided and all pairs of contact surfaces are connected to one another in a series circuit.

18. The device of claim 17, wherein the series circuit has at least one resistor.

19. The device of claim 17, wherein the electrically conductive connecting arrangement is one of a screw, a rivet, a washer, a nut, an electrically conductive adhesive, a soldered connection, a welded connection or an electrically conductive clamp, a latch and a snap device, wherein the carrier is a housing accommodating the circuit board, and wherein the evaluation circuit is situated on the circuit board.

* * * * *

UNITED STATES PATENT AND TRADEMARK OFFICE
CERTIFICATE OF CORRECTION

PATENT NO.       : 8,466,688 B2
APPLICATION NO. : 12/451138
DATED            : June 18, 2013
INVENTOR(S)      : Feucht et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 399 days.

Signed and Sealed this
Eighth Day of September, 2015

Michelle K. Lee
*Director of the United States Patent and Trademark Office*